(12) United States Patent
Burton

(10) Patent No.: US 11,923,431 B2
(45) Date of Patent: Mar. 5, 2024

(54) BIPOLAR JUNCTION TRANSISTORS INCLUDING EMITTER-BASE AND BASE-COLLECTOR SUPERLATTICES

(71) Applicant: ATOMERA INCORPORATED, Los Gatos, CA (US)

(72) Inventor: Richard Burton, Phoenix, AZ (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 17/873,426

(22) Filed: Jul. 26, 2022

(65) Prior Publication Data

US 2022/0367676 A1 Nov. 17, 2022

Related U.S. Application Data

(62) Division of application No. 16/913,546, filed on Jun. 26, 2020, now Pat. No. 11,437,487.

(Continued)

(51) Int. Cl.
*H01L 29/66* (2006.01)
*H01L 29/08* (2006.01)
(Continued)

(52) U.S. Cl.
CPC .... *H01L 29/66272* (2013.01); *H01L 29/0821* (2013.01); *H01L 29/1004* (2013.01); *H01L 29/152* (2013.01); *H01L 29/732* (2013.01)

(58) Field of Classification Search
CPC ........... H01L 29/66272; H01L 29/0821; H01L 29/1004; H01L 29/152; H01L 29/732;
(Continued)

(56) References Cited

U.S. PATENT DOCUMENTS 4,937,204 A 6/1990 Ishibashi et al.
5,101,256 A 3/1992 Harame et al.
(Continued)

FOREIGN PATENT DOCUMENTS

GB 2347520 6/2000
TW 200701452 1/2007
(Continued)

OTHER PUBLICATIONS

U.S. Appl. No. 16/176,005, filed Oct. 31, 2018 Weeks et al. See Priority U.S. Appl. No. 16/913,546, filed Jun. 26, 2020.
(Continued)

*Primary Examiner* — Mohammad A Rahman
(74) *Attorney, Agent, or Firm* — ALLEN, DYER, DOPPELT, + GILCHRIST, P.A. Attorneys at Law

(57) ABSTRACT

A bipolar junction transistor (BJT) may include a substrate defining a collector region therein. A first superlattice may be on the substrate including a plurality of stacked groups of first layers, with each group of first layers including a first plurality of stacked base semiconductor monolayers defining a first base semiconductor portion, and at least one first non-semiconductor monolayer constrained within a crystal lattice of adjacent first base semiconductor portions. Furthermore, a base may be on the first superlattice, and a second superlattice may be on the base including a second plurality of stacked groups of second layers, with each group of second layers including a plurality of stacked base semiconductor monolayers defining a second base semiconductor portion, and at least one second non-semiconductor monolayer constrained within a crystal lattice of adjacent second base semiconductor portions. An emitter may be on the second superlattice.

8 Claims, 13 Drawing Sheets

Related U.S. Application Data

(60) Provisional application No. 62/960,851, filed on Jan. 14, 2020.

(51) Int. Cl.
*H01L 29/732* (2006.01)
*H01L 29/15* (2006.01)
*H01L 29/10* (2006.01)

(58) Field of Classification Search
CPC ..... H01L 29/0804; H01L 29/16; H01L 29/15; H01L 29/78687; H01L 31/035236; H01L 31/035263; H01L 31/035254; H01L 33/04; H01L 21/02507
See application file for complete search history.

(56) References Cited

U.S. PATENT DOCUMENTS

| | | | |
|---|---|---|---|
| 5,216,262 A | 6/1993 | Tsu | |
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,576,535 B2 | 6/2003 | Drobny et al. | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,420,228 B2 | 9/2008 | Bock et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,781,827 B2 | 4/2010 | Rao | |
| 7,718,996 B2 | 5/2010 | Dukovski et al. | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 9,941,359 B2 | 4/2018 | Mears et al. | |
| 9,972,685 B2 | 5/2018 | Mears et al. | |
| 10,056,477 B1 | 8/2018 | Choi et al. | |
| 10,068,997 B1 | 9/2018 | Preisler | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 10,170,560 B2 | 1/2019 | Mears | |
| 10,170,603 B2 | 1/2019 | Mears et al. | |
| 10,170,604 B2 | 1/2019 | Mears et al. | |
| 10,191,105 B2 | 1/2019 | Roy | |
| 10,249,745 B2 | 4/2019 | Mears et al. | |
| 10,276,625 B1 | 4/2019 | Mears et al. | |
| 10,304,881 B1 | 4/2019 | Chen et al. | |
| 10,355,151 B2 | 7/2019 | Chen et al. | |
| 10,361,243 B2 | 7/2019 | Mears et al. | |
| 10,367,028 B2 | 7/2019 | Chen et al. | |
| 10,367,064 B2 | 7/2019 | Rao | |
| 10,381,242 B2 | 8/2019 | Takeuchi | |
| 10,396,223 B2 | 8/2019 | Chen et al. | |
| 10,410,880 B2 | 9/2019 | Takeuchi | |
| 10,453,945 B2 | 10/2019 | Mears et al. | |
| 10,461,118 B2 | 10/2019 | Chen et al. | |
| 10,468,245 B2 | 11/2019 | Weeks et al. | |
| 10,529,757 B2 | 1/2020 | Chen et al. | |
| 10,529,768 B2 | 1/2020 | Chen et al. | |
| 10,566,191 B1 | 2/2020 | Weeks et al. | |
| 10,580,866 B1 | 3/2020 | Takeuchi et al. | |
| 10,580,867 B1 | 3/2020 | Takeuchi et al. | |
| 10,593,761 B1 | 3/2020 | Takeuchi et al. | |
| 10,608,027 B2 | 3/2020 | Chen et al. | |
| 10,608,043 B2 | 3/2020 | Chen et al. | |
| 10,615,209 B2 | 4/2020 | Chen et al. | |
| 2002/0070390 A1* | 6/2002 | Chow | H01L 29/155 257/E29.189 |
| 2003/0034529 A1 | 2/2003 | Fitzgerald et al. | |
| 2003/0057416 A1 | 3/2003 | Currie et al. | |
| 2004/0188711 A1 | 9/2004 | Coolbaugh et al. | |
| 2005/0167653 A1 | 8/2005 | Mears et al. | |
| 2005/0282330 A1 | 12/2005 | Mears et al. | |
| 2006/0220118 A1 | 10/2006 | Stephenson et al. | |
| 2006/0267130 A1 | 11/2006 | Rao | |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0258134 A1 | 10/2008 | Mears et al. | |
| 2011/0215299 A1 | 9/2011 | Rao | |
| 2014/0264458 A1 | 9/2014 | Preisler et al. | |
| 2015/0041956 A1 | 2/2015 | Cheng et al. | |
| 2015/0357414 A1 | 12/2015 | Mears | |
| 2016/0149023 A1 | 5/2016 | Mears et al. | |
| 2016/0358773 A1 | 12/2016 | Mears et al. | |
| 2018/0301584 A1 | 10/2018 | Augusto | |
| 2018/0337064 A1* | 11/2018 | Takeuchi | H01L 21/3221 |
| 2018/0358361 A1 | 12/2018 | Rao | |
| 2019/0057896 A1 | 2/2019 | Stephenson et al. | |
| 2019/0058059 A1 | 2/2019 | Stephenson et al. | |
| 2019/0189652 A1 | 6/2019 | Chen et al. | |
| 2019/0279869 A1 | 9/2019 | Weeks et al. | |
| 2019/0279897 A1 | 9/2019 | Stephenson et al. | |
| 2019/0280090 A1 | 9/2019 | Stephenson et al. | |
| 2019/0317277 A1 | 10/2019 | Stephenson | |
| 2019/0319135 A1 | 10/2019 | Stephenson | |
| 2019/0319136 A1 | 10/2019 | Stephenson | |

(56) References Cited

U.S. PATENT DOCUMENTS

2019/0319167 A1    10/2019   Stephenson
2020/0075731 A1     3/2020   Weeks et al.

FOREIGN PATENT DOCUMENTS

TW        200903800     1/2009
WO      2017059146     4/2017

OTHER PUBLICATIONS

U.S. Appl. No. 16/192,897, filed Nov. 16, 2018 Connelly et al. See Priority U.S. Appl. No. 16/913,546, filed Jun. 26, 2020.
U.S. Appl. No. 16/192,911, filed Nov. 16, 2018 Takeuchi et al. See Priority U.S. Appl. No. 16/913,546, filed Jun. 26, 2020.
U.S. Appl. No. 16/192,923, filed Nov. 16, 2018 Takeuchi et al. See Priority U.S. Appl. No. 16/913,546, filed Jun. 26, 2020.
U.S. Appl. No. 16/192,987, filed Nov. 16, 2018 Takeuchi et al. See Priority U.S. Appl. No. 16/913,546, filed Jun. 26, 2020.
U.S. Appl. No. 16/913,000, filed Nov. 16, 2018 Takeuchi et al. See Priority U.S. Appl. No. 16/913,546, filed Jun. 26, 2020.
U.S. Appl. No. 16/913,011, filed Nov. 16, 2018 Takeuchi et al. See Priority U.S. Appl. No. 16/913,546, filed Jun. 26, 2020.
U.S. Appl. No. 16/513,528, filed 17/17, 2019; Burton et al. See Priority U.S. Appl. No. 16/913,546, filed Jun. 26, 2020.
U.S. Appl. No. 16/513,832, filed 17/17, 2019 Burton et al. See Priority U.S. Appl. No. 16/913,546, filed Jun. 26, 2020.
U.S. Appl. No. 16/513,845, filed 17/17, 2019 Burton et al. See Priority U.S. Appl. No. 16/913,546, filed Jun. 26, 2020.
U.S. Appl. No. 16/513,875, filed 17/17, 2019 Burton et al. See Priority U.S. Appl. No. 16/913,546, filed Jun. 26, 2020.
U.S. Appl. No. 16/513,895, filed 17/17, 2019 Burton et al. See Priority U.S. Appl. No. 16/913,546, filed Jun. 26, 2020.
U.S. Appl. No. 16/513,906, filed 17/17, 2019 Burton et al. See Priority U.S. Appl. No. 16/913,546, filed Jun. 26, 2020.
U.S. Appl. No. 16/513,932, filed 17/17, 2019 Burton et al. See Priority U.S. Appl. No. 16/913,546, filed Jun. 26, 2020.
U.S. Appl. No. 16/513,943, filed 17/17, 2019 Burton et al. See Priority U.S. Appl. No. 16/913,546, filed Jun. 26, 2020.
U.S. Appl. No. 16/801,287, filed Feb. 26, 2020 Weeks et al. See Priority U.S. Appl. No. 16/913,546, filed Jun. 26, 2020.
U.S. Appl. No. 16/801,305, filed Feb. 26, 2020 Weeks et al. See Priority U.S. Appl. No. 16/913,546, filed Jun. 26, 2020.
U.S. Appl. No. 16/810,957, filed Mar. 6, 2020 Cody et al. See Priority U.S. Appl. No. 16/913,546, filed Jun. 26, 2020.
U.S. Appl. No. 16/853,875, filed Apr. 21, 2020 Hideki Takeuchi See Priority U.S. Appl. No. 16/913,546, filed Jun. 26, 2020.
U.S. Appl. No. 16/853,884, filed Apr. 21, 2020 Hideki Takeuchi See Priority U.S. Appl. No. 16/913,546, filed Jun. 26, 2020.
U.S. Appl. No. 16/898,589, filed Jun. 11, 2020 Takeuchi et al. See Priority U.S. Appl. No. 16/913,546, filed Jun. 26, 2020.
U.S. Appl. No. 16/913,546, filed Jun. 26, 2020 Burton See Priority U.S. Appl. No. 16/913,546, filed Jun. 26, 2020.
U.S. Appl. No. 16/898,564, filed Jun. 11, 2020 Takeuchi et al. See Priority U.S. Appl. No. 16/913,546, filed Jun. 26, 2020.
Luo et al., "Chemical Design of Direct-Gap Light-Emitting Silicon" published in Physical Review Letters, vol. 89, No. 7; Aug. 12, 2002; 4 pgs. See Priority U.S. Appl. No. 16/913,546, filed Jun. 26, 2020.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2. See Priority U.S. Appl. No. 16/913,546, filed Jun. 26, 2020.
Novikov et al. "Silicon-based Optoelectronics" 1999-2003, pp. 1-6. See Priority U.S. Appl. No. 16/913,546, filed Jun. 26, 2020.
R. Tsu "Phenomena in silicon nanostructure device" published online Sep. 6, 2000 by Applied Physics and Materials Science & Processing, pp. 391-402 See Priority U.S. Appl. No. 16/913,546, filed Jun. 26, 2020.
R. Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only. See Priority U.S. Appl. No. 16/913,546, filed Jun. 26, 2020.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016. See Priority U.S. Appl. No. 16/913,546, filed Jun. 26, 2020.
Xu et al. "Extension of planar bulk n-channel MOSFET scaling with oxygen insertion technology" IEEE Transactions on Electron devices, vol. 61, No. 9; Sep. 2014. pp. 3345-3349. See Priority U.S. Appl. No. 16/913,546, filed Jun. 26, 2020.
Xu et al., "MOSFET performance and scalability enhancement by insertion of oxygen layers", Department of Electrical Engineering and Computer Science, University of California, Berkeley, 2012, pp. 1-4. See Priority U.S. Appl. No. 16/913,546, filed Jun. 26, 2020.
U.S. Appl. No. 16/913,487, filed Jun. 26, 2020 Burton See Priority U.S. Appl. No. 16/913,546, filed Jun. 26, 2020.

* cited by examiner

BIPOLAR JUNCTION TRANSISTORS INCLUDING EMITTER-BASE AND BASE-COLLECTOR SUPERLATTICES

RELATED APPLICATIONS

This application is a divisional application of U.S. patent application Ser. No. 16/913,546 filed Jun. 26, 2020, and claims the benefit of U.S. provisional application Ser. No. 62/960,851 filed Jan. 14, 2020, which are hereby incorporated herein in their entireties by reference.

TECHNICAL FIELD

The present disclosure generally relates to semiconductor devices and, more particularly, to bipolar junction transistors (BJTs) and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A bipolar junction transistor (BJT) may include a substrate defining a collector region therein. A first superlattice may be on the substrate including a plurality of stacked groups of first layers, with each group of first layers including a first plurality of stacked base semiconductor monolayers defining a first base semiconductor portion, and at least one first non-semiconductor monolayer constrained within a crystal lattice of adjacent first base semiconductor portions. Furthermore, a base may be on the first superlattice, and a second superlattice may be on the base including a second plurality of stacked groups of second layers, with each group of second layers including a plurality of stacked base semiconductor monolayers defining a second base semiconductor portion, and at least one second non-semiconductor monolayer constrained within a crystal lattice of adjacent second base semiconductor portions. An emitter may be on the second superlattice.

In an example configuration, the substrate may further define a sub-collector region below the collector region, and the BJT may further include a third superlattice in the substrate between the sub-collector region and the collector region. More particularly, the third superlattice may include a third plurality of stacked groups of third layers, with each group of third layers including a third plurality of stacked base semiconductor monolayers defining a third base semiconductor portion, and at least one third non-semiconductor monolayer constrained within a crystal lattice of adjacent third base semiconductor portions.

The BJT may further include an emitter contact on an upper surface of the emitter, as well as a base contact on at least a portion of the base. The BJT may also include spaced apart isolation regions in the substrate. The emitter and the collector may have a first conductivity type, and the base may have a second conductivity type different than the first conductivity type.

In one example embodiment, the respective base semiconductor monolayers of the first and second superlattices may comprise silicon monolayers. In accordance with another example, the respective base semiconductor monolayers of the first and second superlattices may comprise germanium. Also by way of example, the respective at least one non-semiconductor monolayer of the first and second superlattices may comprise at least one of oxygen, nitrogen, fluorine, carbon and carbon-oxygen.

DETAILED DESCRIPTION

Figure 1:
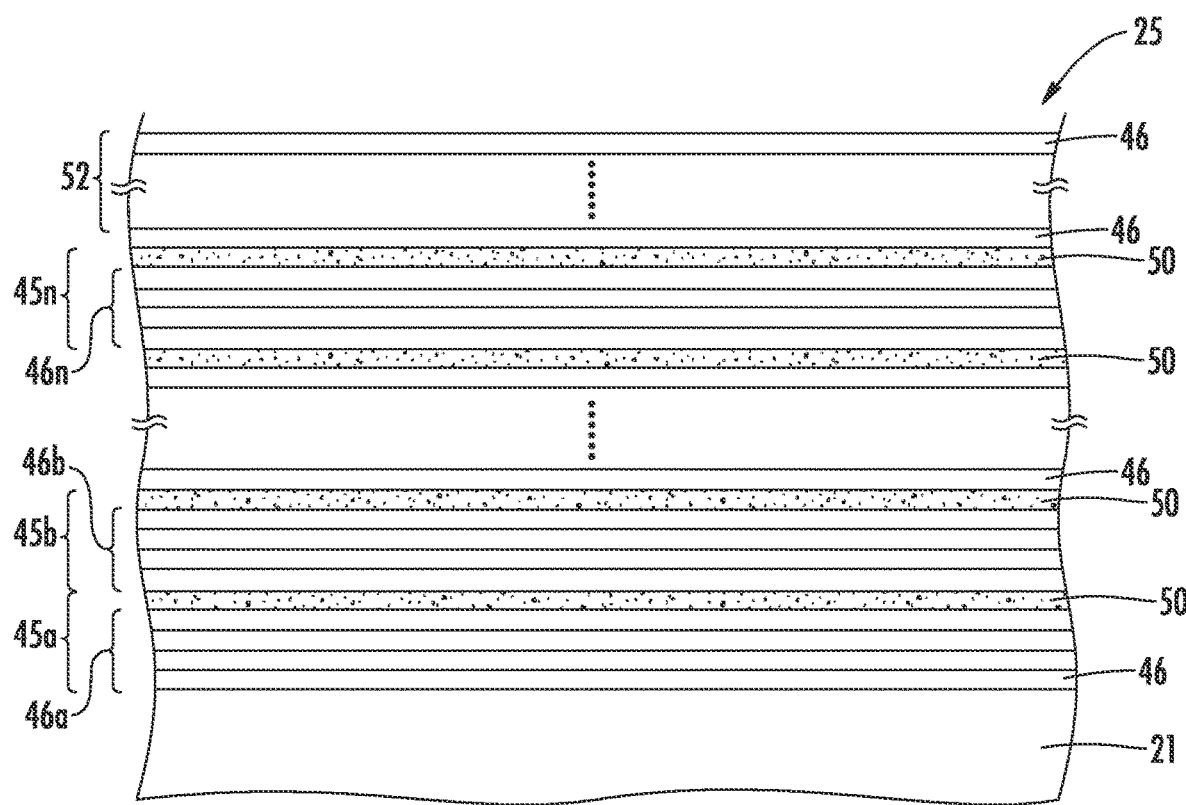
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to Bipolar Junction Transistors (BJTs) having an enhanced semiconductor superlattice therein to provide dopant blocking and performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
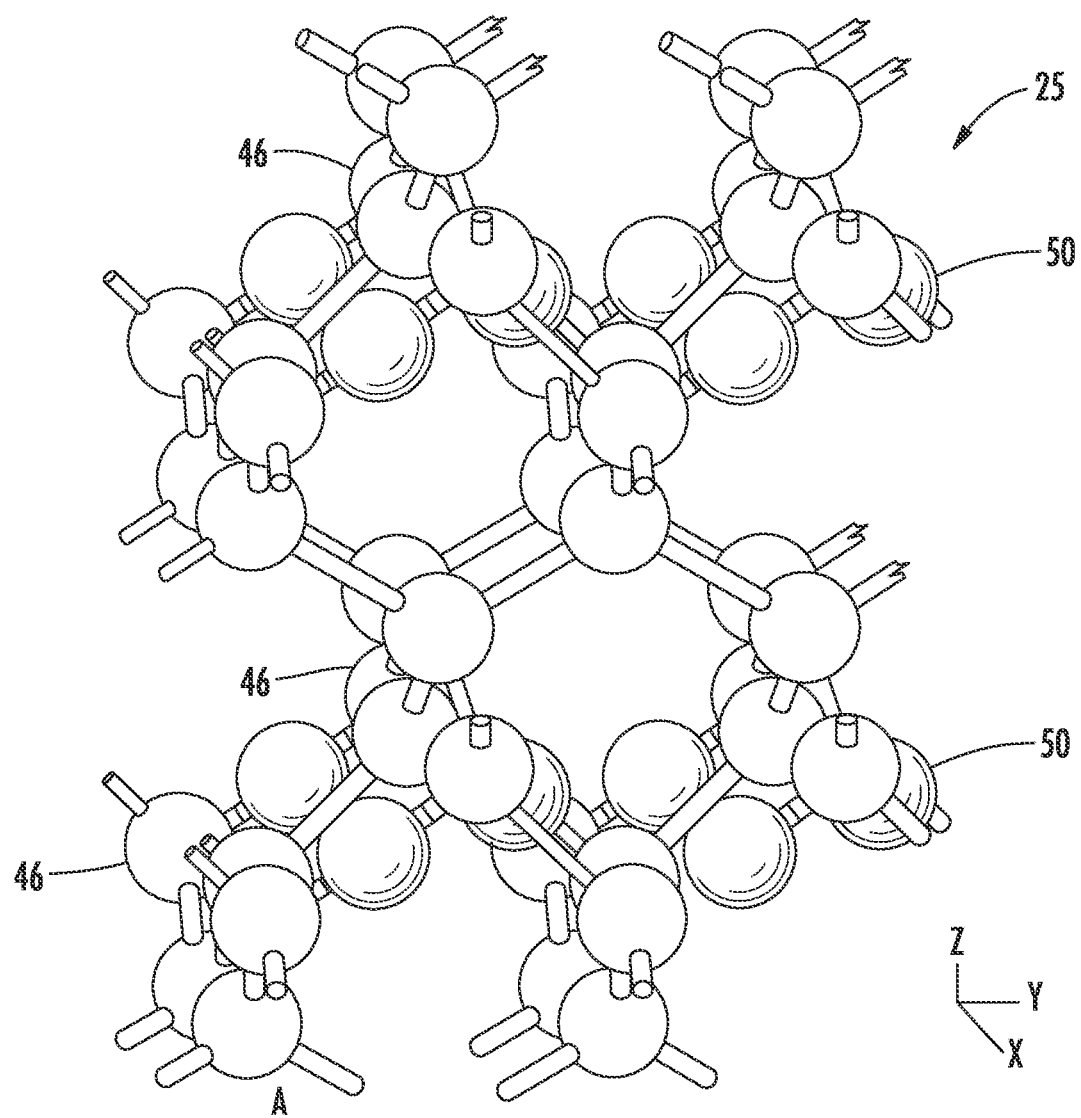
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
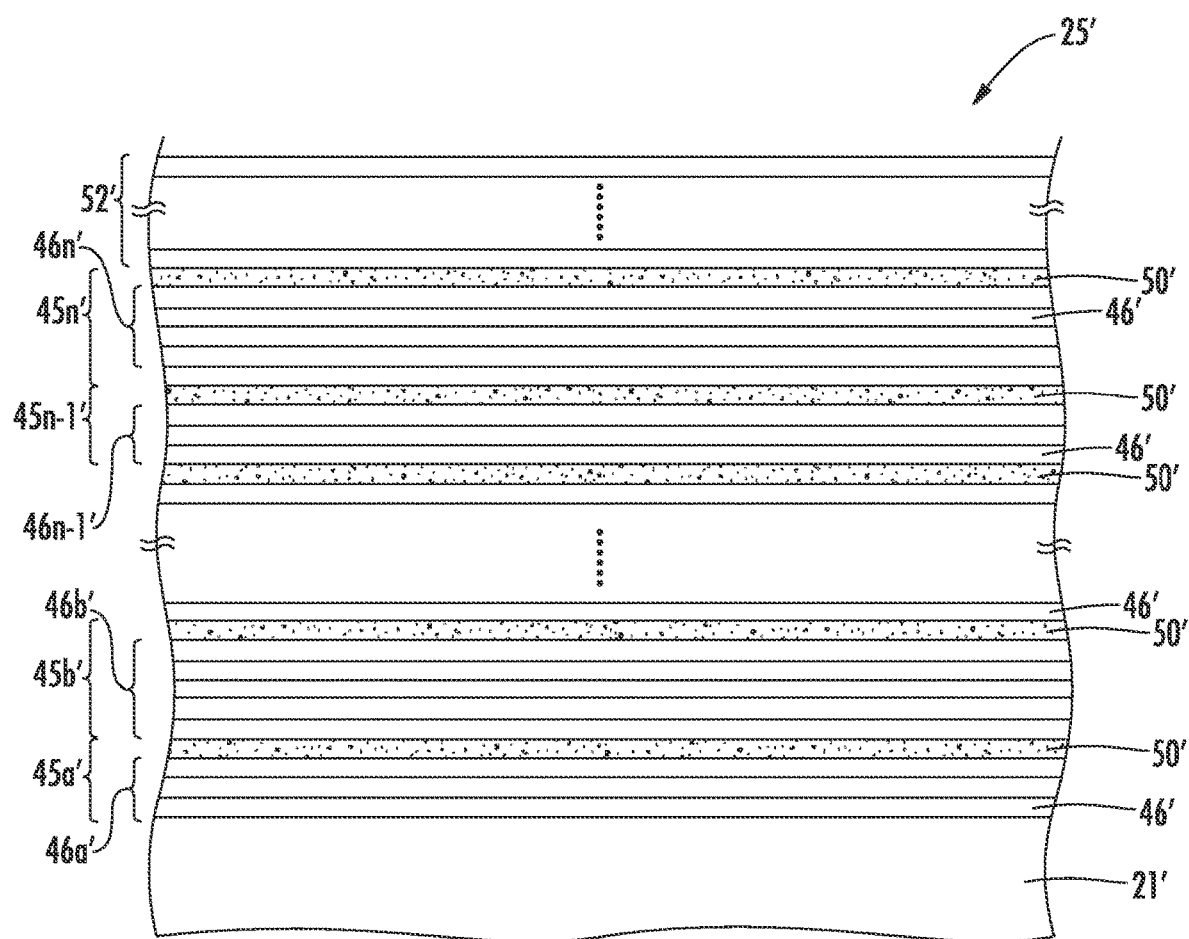
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
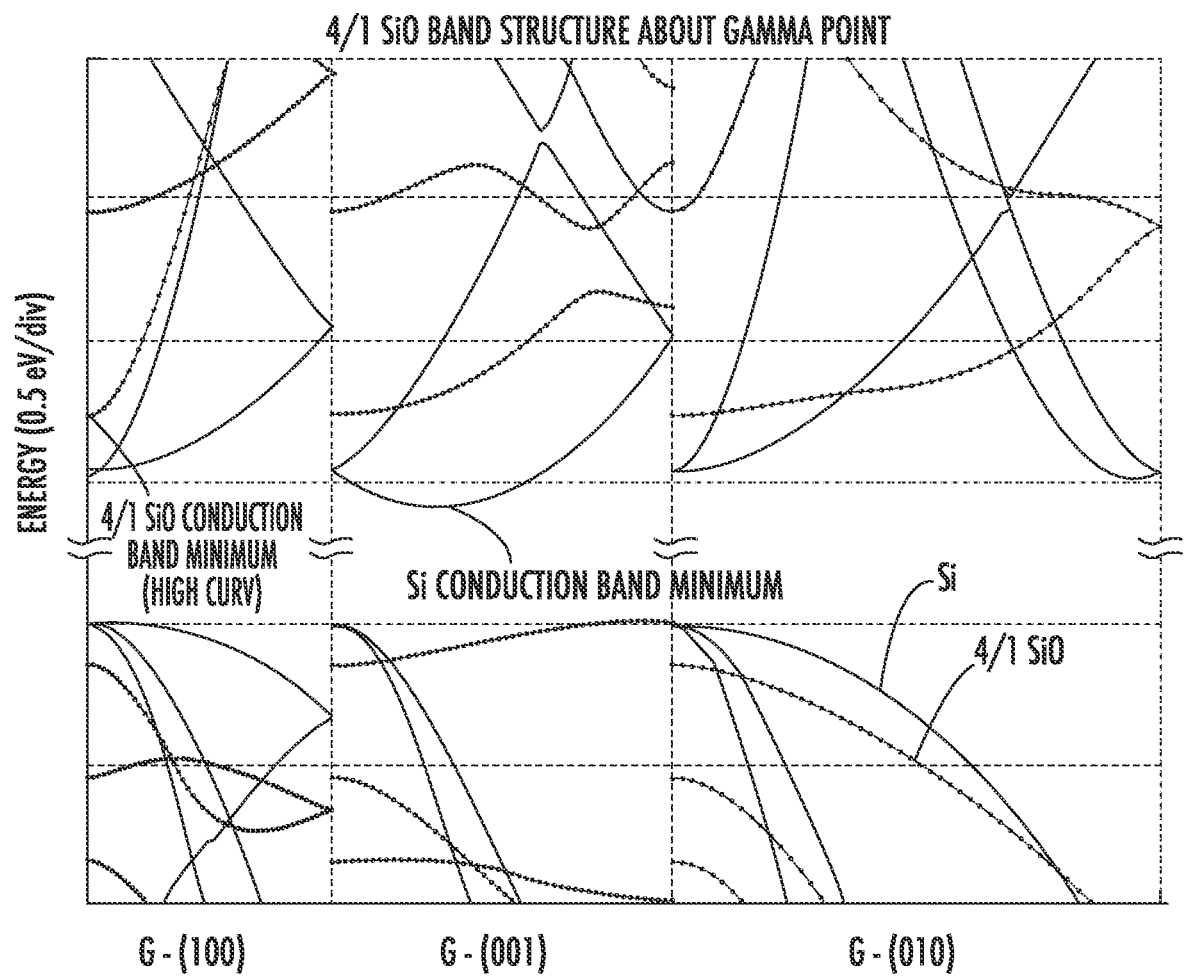
FIG. 4A is a graph of the calculated band structure from the gamma point (G) for both bulk silicon as in the prior art, and for the 4/1 Si/O superlattice as shown in FIGS. 1-2.
Figure 4B:
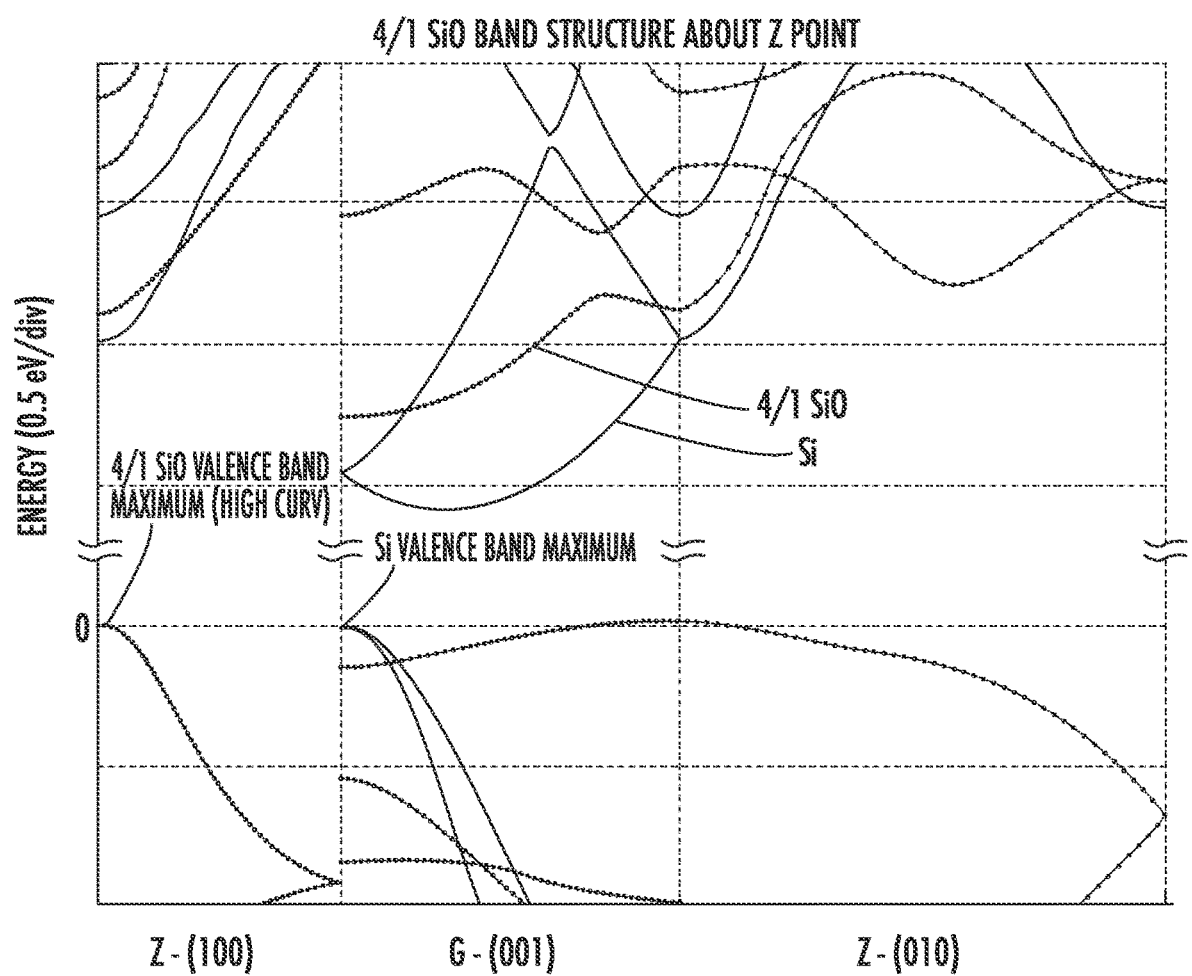
FIG. 4B is a graph of the calculated band structure from the Z point for both bulk silicon as in the prior art, and for the 4/1 Si/O superlattice as shown in FIGS. 1-2.
Figure 4C:
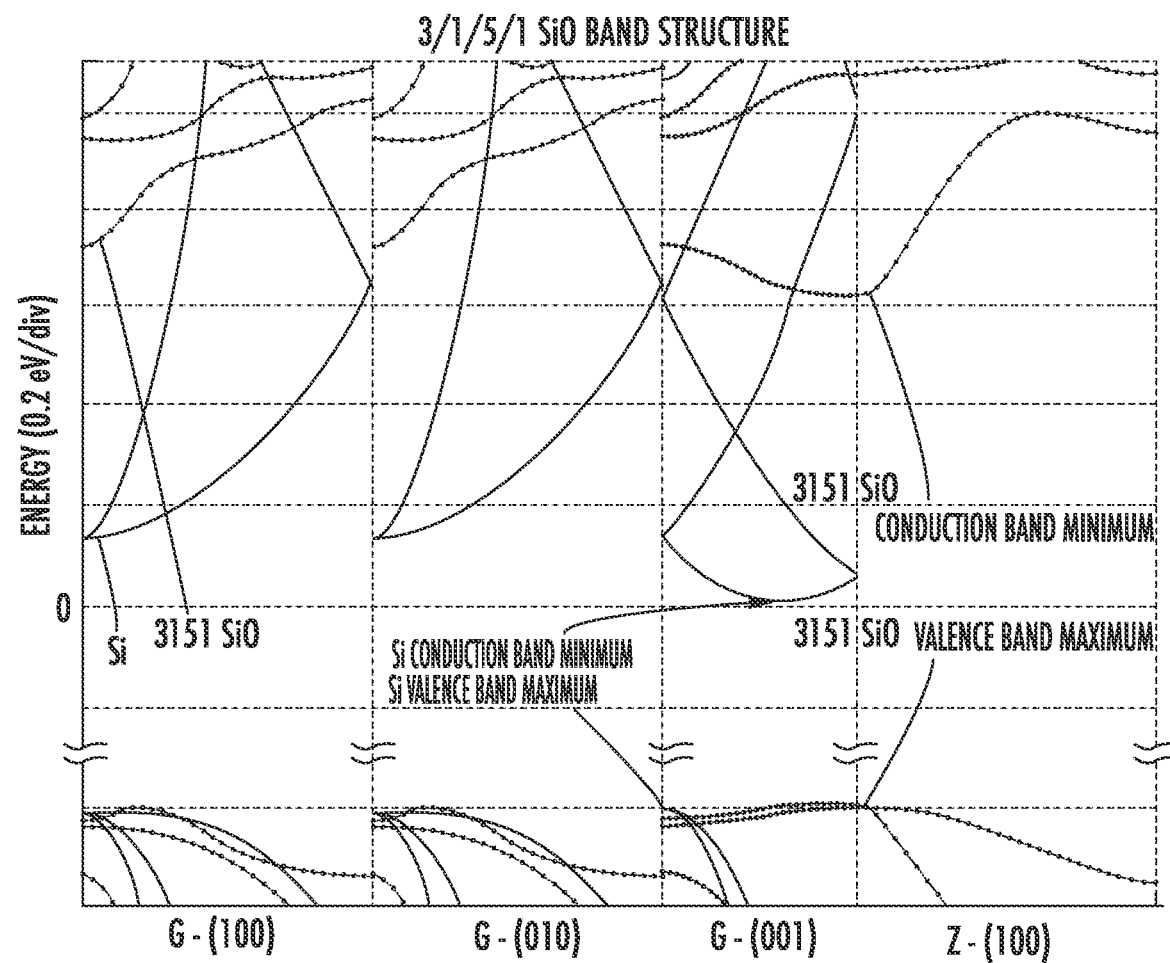
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
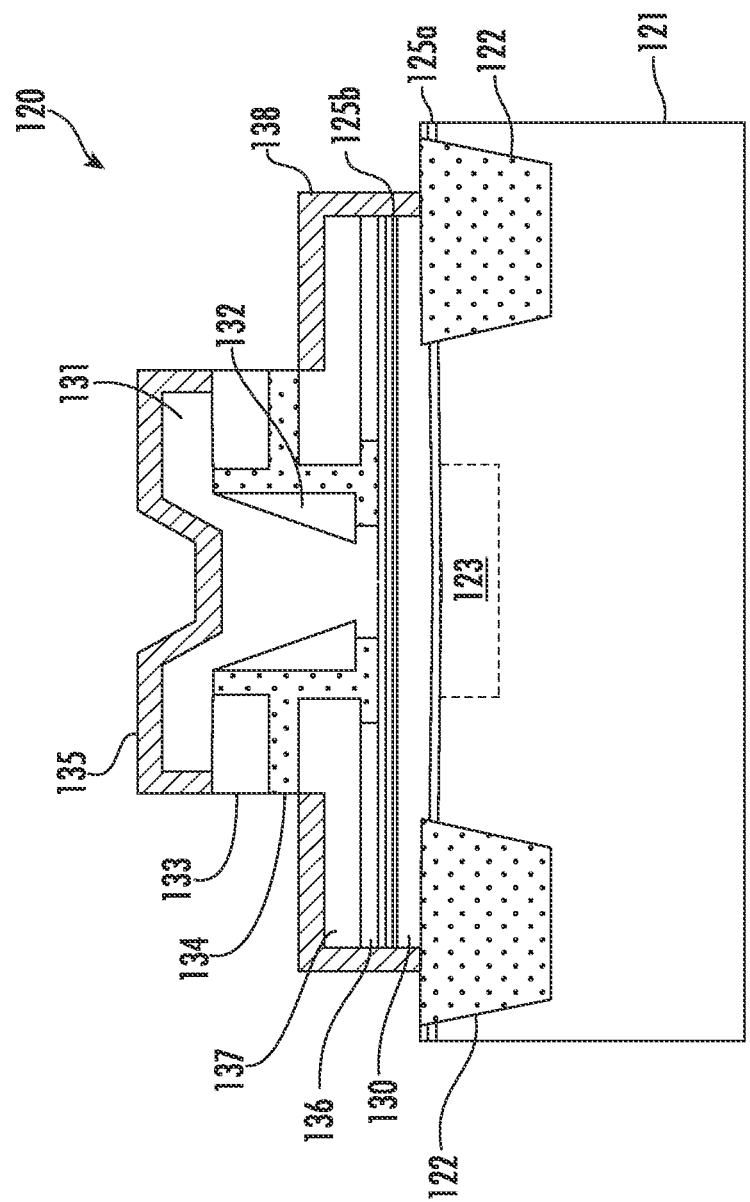
FIG. 5 is schematic cross-sectional diagram of a bipolar junction transistor (BJT) including superlattices as described with reference to FIGS. 1-4C separating the base/collector and emitter/base in accordance with an example embodiment.

Referring now to FIG. 5, the above-described superlattice structures may advantageously be used to provide dopant diffusion barriers in Bipolar Junction Transistors (BJTs), such as silicon BJTs with polysilicon/crystalline silicon emitters and silicon/SiGe bases for NPN and PNP bipolar devices, for example. By way of background, typical BJTs utilize high doping in the emitter, which generally results in diffusion of the dopant into the base, and thus a degradation in performance. However, the above-described superlattice/MST material may be used to advantageously block dopants from a highly doped emitter region from diffusing into the base and/or emitter, and thereby degrading performance. Moreover, the MST material may also advantageously block interstitial injection during oxide growth during device fabrication.

In the present example, a BJT 120 illustratively includes a substrate 121 (e.g., a silicon substrate) including spaced apart shallow trench isolation (STI) regions 122 (e.g., $SiO_2$) therein. In the case of an NPN configuration, the substrate 121 may be doped with an N-type dopant (e.g., phosphorus, arsenic, etc.) to define a collector region 123 for the BJT 120. It should be noted that in some embodiments the collector dopant may be further distributed throughout the substrate 121 and not concentrated in a given location as shown in FIG. 5. A first superlattice 125*a* having a structure as described above is positioned between the substrate 121 and a base 130 overlying the first superlattice. The base 130 may comprise a semiconductor such as Si, Ge, or SiGe, and in an NPN configuration may be heavily P-doped with a dopant such as boron, for example. A second superlattice 125*b*, which again may have a structure as described further above, is positioned on the base 130.

An emitter 131 is positioned on the second superlattice 125*b* such that the second superlattice separates the emitter from the base 130. The emitter 130 may comprise a semiconductor (e.g., Si, Ge, or SiGe), and it is defined by adjacent spacers 132, 133 (e.g., nitride) and insulating regions 134 (e.g., oxide). The emitter 131 has an opposite conductivity type from the base 130, e.g., N+ in the example NPN configuration. An emitter contact 135 (e.g., silicide) overlies the emitter 130. Moreover, lower and upper extrinsic base regions 136, 137 are laterally outside of the emitter 130, and the lower extrinsic base region is positioned on the outer ends of the second superlattice 125*b*. The lower and upper extrinsic base regions 136, 137 may also comprise a semiconductor (e.g., Si, Ge, or SiGe) and have a similar doping profile to the base 130 (P+ in the present example). A base contact 138 (e.g., silicide) overlies the extrinsic base regions 136, 137, and contacts outer ends of the second superlattice 125*b* and base 130, as shown.

In typical BJT devices, the highly concentrated doping in the base results in diffusion of the base dopant into the collector, which degrades performance through widening of the base. However, in the BJT 120, the second superlattice 125*b* is advantageously positioned to block the dopants from the highly doped base 130 from diffusing into the collector 131, and thereby degrading performance from the widened base. Moreover, the first superlattice 125*a* is advantageously positioned to block interstitial injection during oxide growth that is performed during device fabrication, thereby also reducing dopant diffusion from the base 130 to the collector 123.

Figure 6:
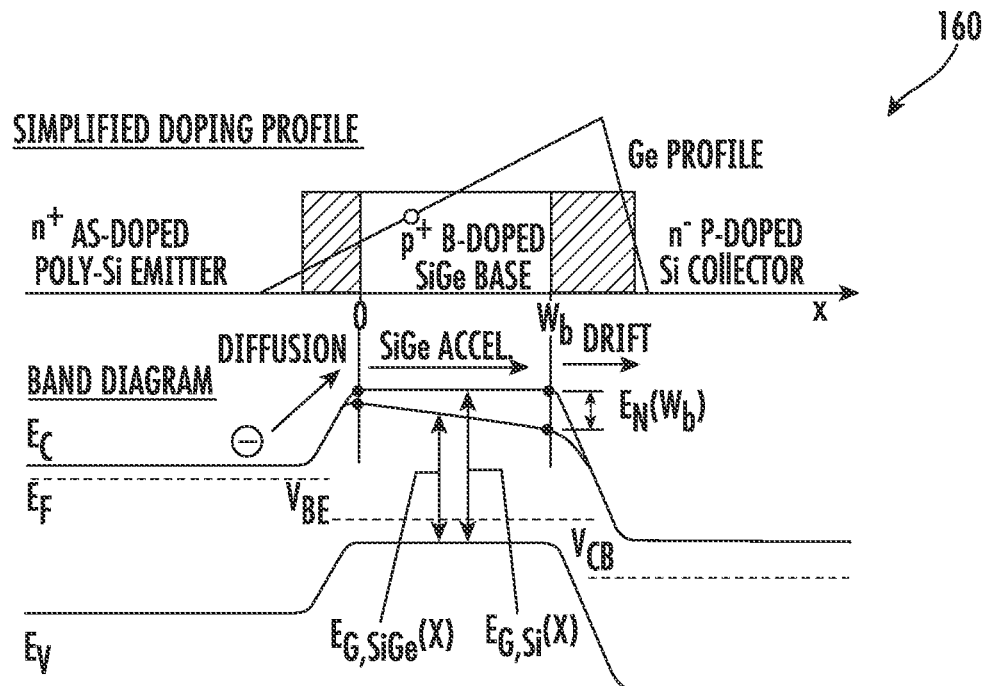
FIG. 6 is a graph of a simulated doping profile for the BJT of FIG. 5 in accordance with an example configuration.
Figure 7:
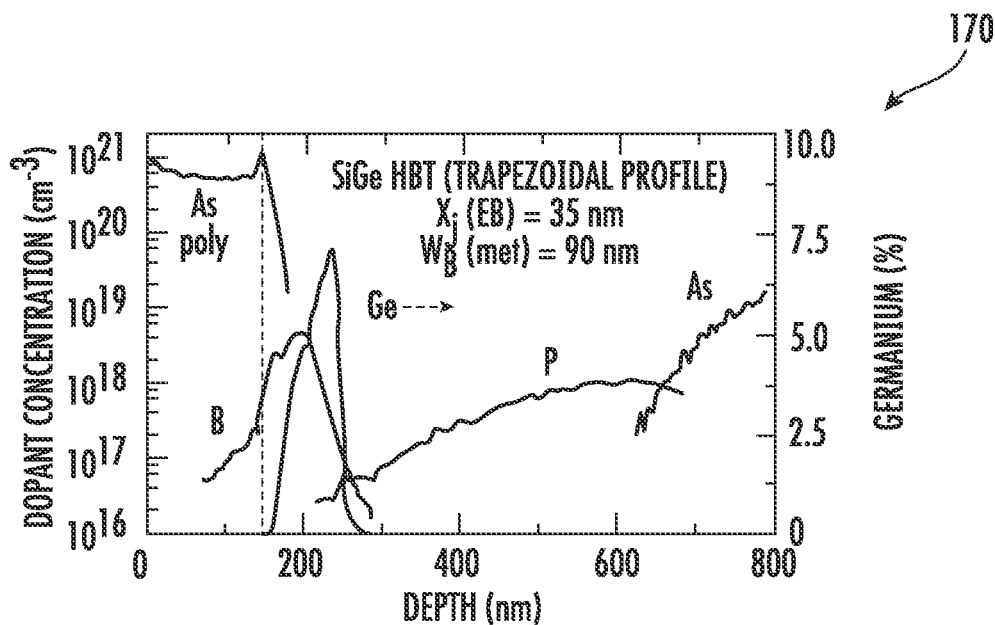
FIG. 7 is a graph of simulated dopant concentration vs. depth for the BJT of FIG. 5 in accordance with an example implementation.

The foregoing dopant retention properties will be further understood with reference to the graphs 160 and 170 of FIGS. 6 and 7, respectively. The graph 160 illustrates a simulated doping profile for an example implementation of the BJT 120 in which the emitter 131 is N+ arsenic-doped polysilicon, the base 130 is P+ boron-doped SiGe, and the collector 123 is N phosphorous-doped silicon, although different semiconductor materials and dopant types/concentrations may be used in different embodiments. The graph 170 illustrates the corresponding simulated dopant concentrations (in $cm^{-3}$) and Ge percentage across the emitter/base/collector layers for the same BJT device.

By way of contrast, the use of carbon doping in typical BJTs for dopant blocking results in a relatively high strain as compared to the MST material used for the first and second superlattices 125*a*, 125*b*, which advantageously provides improved dopant blocking through the incorporation of oxygen monolayers therein. Yet, the MST material still provides for epitaxial growth of the base notwithstanding the inclusion of the oxygen to provide dopant blocking, as discussed further above.

Figure 8:
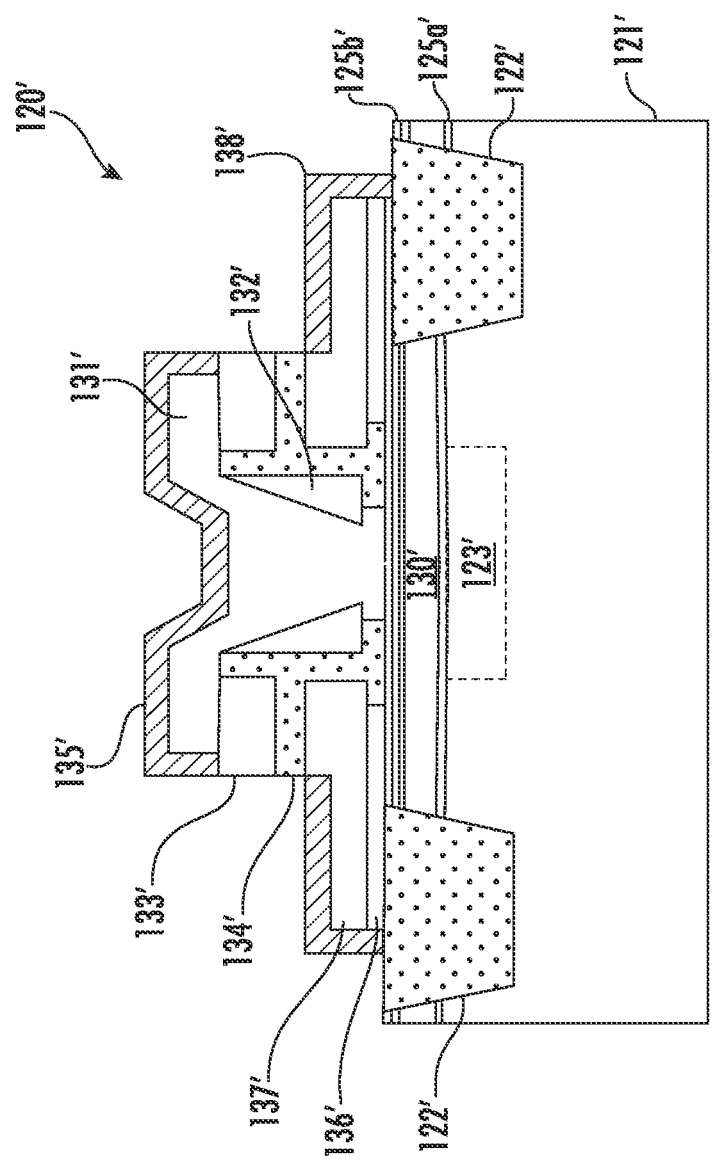
FIG. 8 is a schematic block diagram of an alternative embodiment of the BJT of FIG. 5 in accordance with an example embodiment.
Figure 9:
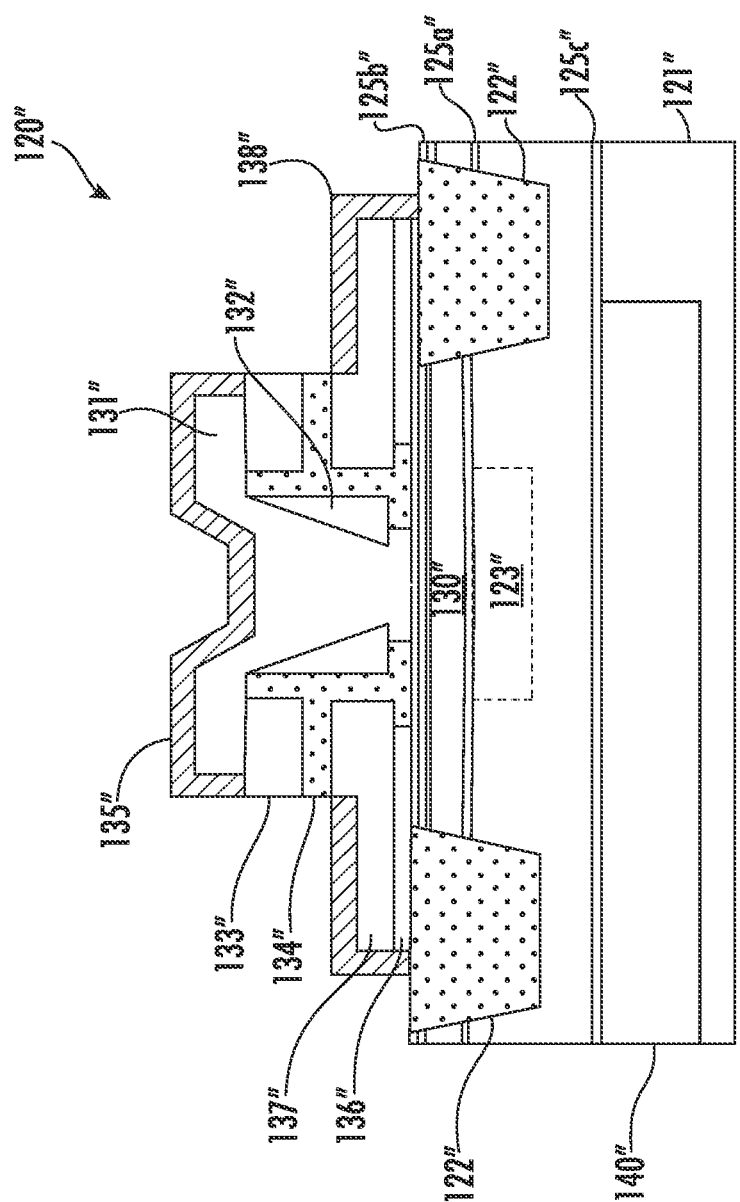
FIG. 9 is a schematic block diagram of another alternative embodiment of the BJT of FIG. 5 in accordance with an example embodiment.

In accordance with other example embodiments of the BJT 120', 120" illustrated in FIGS. 8 and 9, respectively, the base 130', 130" is recessed below an upper surface of the STI regions 122', 122". Moreover, in the BJT 120", the substrate 121" further defines a sub-collector region 140" below the collector region 123", and a third superlattice 125*c'''* is positioned between the sub-collector region and the collector region. More particularly, the third superlattice 125*c"* may also be an MST superlattice as described further above. The other portions/regions of the BJTs 120', 120" are similar to those described above and require no further discussion herein.

Figure 10:
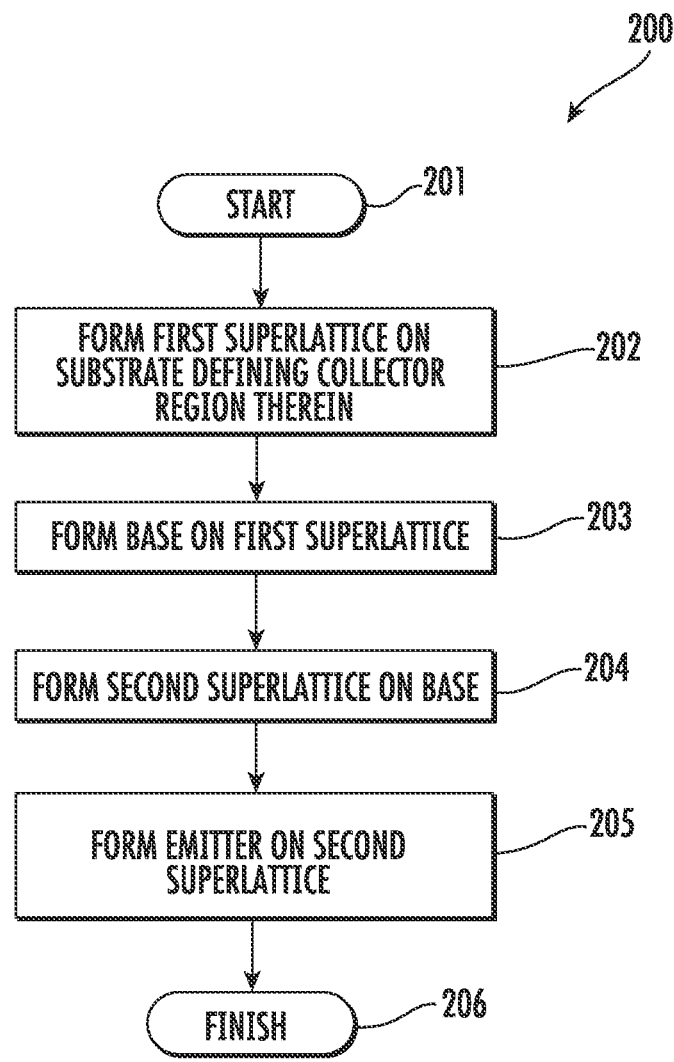
FIG. 10 is a flow diagram illustrating a method for making semiconductor devices such as those shown in FIGS. 7-9.

Turning now to the flow diagram 200 of FIG. 10, a method for making the BJT 120 is described. Beginning at block 201, the method illustratively includes forming the first superlattice 125*a* as described above on the substrate 121 defining a collector region 123 therein, at Block 202. More particularly, for the example BJT 120 the STI regions 122 are formed and the dopant is added for the collector 123 prior to formation of the superlattice 125*a*, which may be done by a blanket formation across the substrate 121 or selectively where desired on the substrate. Moreover, in the example BJT 120", the sub-collector region 140" and superlattice 125*c"* would be formed prior to the STI regions 122", doping of the collector 123", and the first superlattice 125*a"*.

The method further illustratively includes forming the base 130 on the first superlattice 125*a*, at Block 203, and forming a second superlattice 125*b* on the base (Block 204), as also described above. For the BJTs 120' and 120", the base 130', 130" is recessed below the upper surface of the STI regions 122', 122" and may be formed in a cap layer of the superlattice 125*a'* or 125*a"*, for example, as described above. The method further illustratively includes forming an emitter 131 on the second superlattice, at Block 205. Additional processing steps may also be performed to form the other portions/regions described further above, as will be appreciated by those skilled in the art. The method of FIG. 10 illustratively concludes at Block 206.

Further details regarding example BJT structures may be found in U.S. Pat. No. 10,068,997 to Preisler, which is hereby incorporated herein in its entirety by reference.

Figure 11:
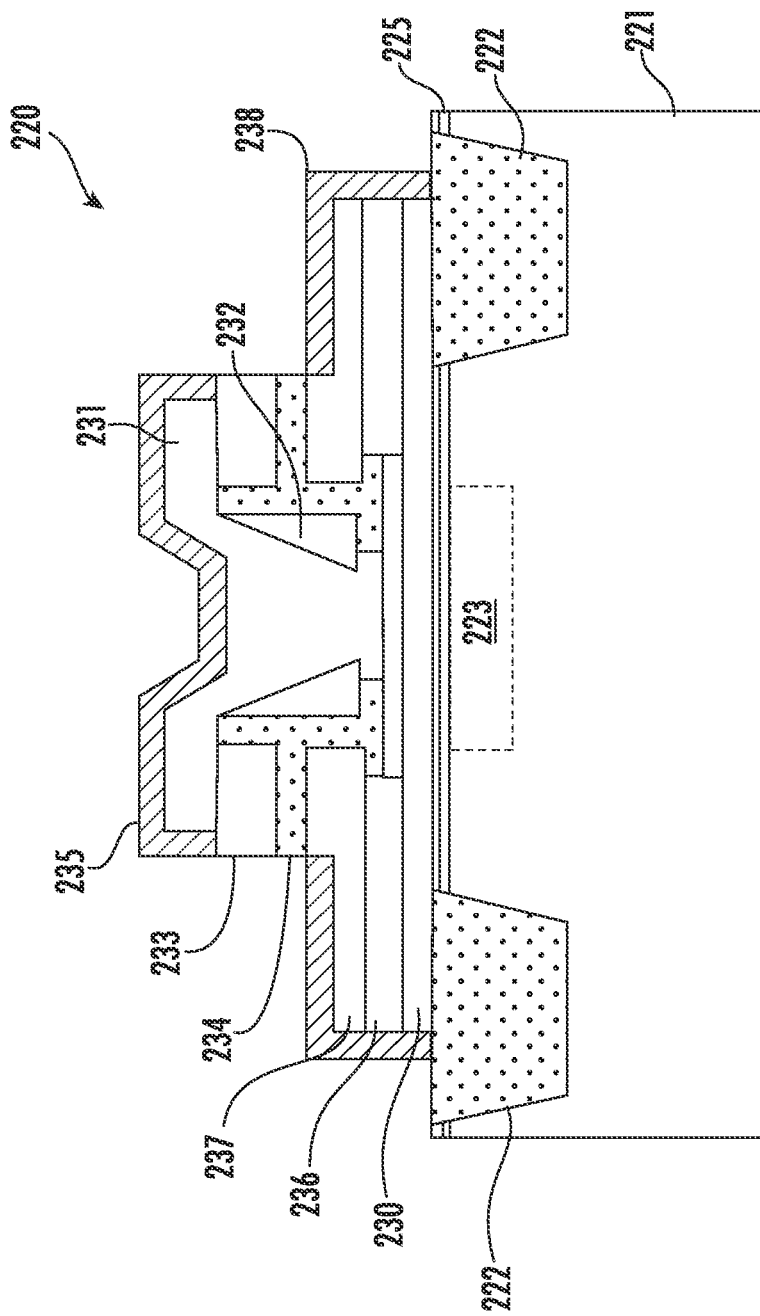
FIGS. 11 and 12 are schematic block diagrams of other alternative embodiments of BJTs in accordance with example embodiments.
Figure 12:
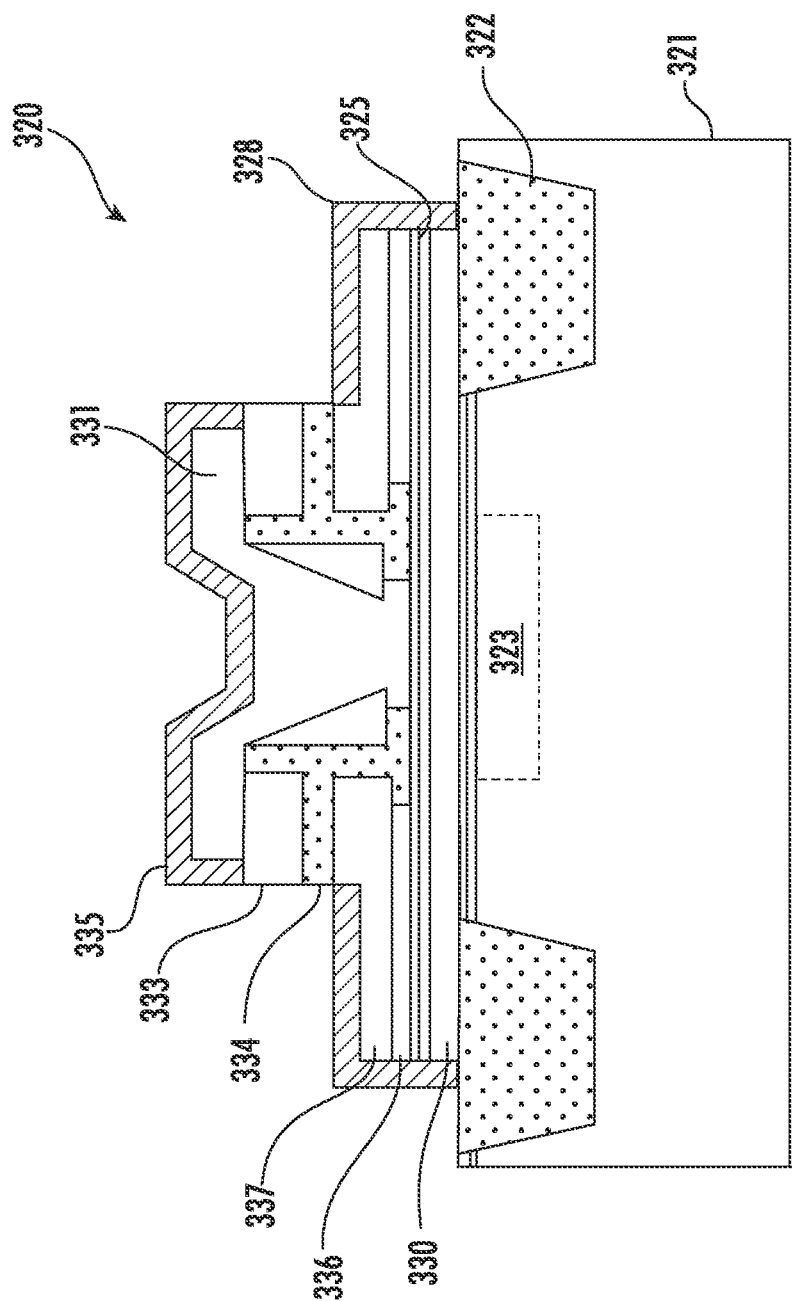

It should also be noted that in certain implementations both of the superlattices 125*a*/125*a'*/125*a"* and 125*b*/125*b'*/125*b"* need not be present. That is, such embodiments may include one or the other of the two superlattices 125*a*/125*a'*/125*a"* and 125*b*/125*b'*/125*b"*. A first example BJT 220 is illustrated in FIG. 11 which includes an MST superlattice 225 between the collector 223 and base 230, but not between the base and the emitter 231. Another example BJT 320 is illustrated in FIG. 12 which includes an MST superlattice 325 between the base 230 and emitter 231, but not between the collector 223 and the base. The remaining components 221, 222, 231-238 and 321, 322, 331-338 shown in FIGS. 11 and 12 are respectively similar to components 121, 122, 131-138 discussed above. A single MST implementation may similarly be used with the configurations shown in FIGS. 8 and 9, if desired.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A bipolar junction transistor (BJT) comprising:
a substrate defining a collector region and a sub-collector region below the collector region;
a superlattice on the substrate comprising a plurality of stacked groups of first layers, each group of the first layers comprising a first plurality of stacked base semiconductor monolayers defining a first base semiconductor portion, and at least one first non-semiconductor monolayer constrained within a crystal lattice of adjacent first base semiconductor portions;
a base on the superlattice;
an emitter on the base; and
another superlattice in the substrate between the sub-collector region and the collector region.

2. The BJT of claim 1 further comprising an emitter contact on an upper surface of the emitter, and a base contact on at least a portion of the base.

3. The BJT of claim 1 wherein the base semiconductor monolayers comprise silicon monolayers.

4. The BJT of claim 1 wherein the at least one non-semiconductor monolayer comprises oxygen.

5. A bipolar junction transistor (BJT) comprising:
a substrate defining a collector region therein and a sub-collector region below the collector region;
a base on the substrate over the collector region;
a superlattice on the base comprising a plurality of stacked groups of layers, each group of the layers comprising a plurality of stacked base semiconductor monolayers defining a base semiconductor portion, and at least one non-semiconductor monolayer constrained within a crystal lattice of adjacent base semiconductor portions;
an emitter on the superlattice; and
another superlattice in the substrate between the sub-collector region and the collector region.

6. The BJT of claim 5 further comprising an emitter contact on an upper surface of the emitter, and a base contact on at least a portion of the base.

7. The BJT of claim 5 wherein the base semiconductor monolayers comprise silicon monolayers.

8. The BJT of claim 5 wherein the at least one non-semiconductor monolayer comprises oxygen.

* * * * *